(12) United States Patent
Ahn et al.

(10) Patent No.: US 11,619,655 B2
(45) Date of Patent: Apr. 4, 2023

(54) PROBE CARD FOR TESTING A PATTERN FORMED ON A WAFER

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 86 days.

(21) Appl. No.: 17/029,979

(22) Filed: Sep. 23, 2020

(65) Prior Publication Data

US 2021/0102975 A1    Apr. 8, 2021

(30) Foreign Application Priority Data

Oct. 4, 2019    (KR) .................. 10-2019-0123270

(51) Int. Cl.
*G01R 1/073*    (2006.01)
*G01R 31/28*    (2006.01)

(52) U.S. Cl.
CPC ..... *G01R 1/07371* (2013.01); *G01R 1/07342* (2013.01); *G01R 31/2831* (2013.01)

(58) Field of Classification Search
CPC ............ G01R 1/07371; G01R 1/07342; G01R 31/2831; G01R 1/07357; G01R 31/2886; G01R 1/07314; G01R 1/0491; G01R 1/07335

See application file for complete search history.

(56) References Cited

U.S. PATENT DOCUMENTS

| | | | |
|---|---|---|---|
| 2004/0051546 A1* | 3/2004 | Thiessen | G01R 1/07307 324/755.11 |
| 2007/0269999 A1* | 11/2007 | Di Stefano | G01R 1/06738 439/73 |
| 2010/0231249 A1* | 9/2010 | Dang | G01R 1/0675 324/750.29 |
| 2018/0052190 A1* | 2/2018 | Perego | G01R 1/06733 |

FOREIGN PATENT DOCUMENTS

JP    5337341 B2    11/2013

* cited by examiner

*Primary Examiner* — Lee E Rodak

(57) ABSTRACT

A probe card is configured to perform a circuit test on a wafer to realize a reduction in size and pitch of probe insertion holes. The probe card includes a first plate, a second plate coupled to a lower portion of the first plate, an upper guide plate provided on an upper surface of the first plate, a lower guide plate provided on a lower surface of the second plate, and a reinforcing plate coupled to at least a surface of each of the upper and lower guide plates. At least one of the upper and lower guide plates is made of an anodic oxide film material, and as viewed from above, the upper and lower guide plates and the reinforcing plate are configured to have smaller areas than the first and second plates, so that upper and lower surfaces of the first and second plates are exposed.

13 Claims, 7 Drawing Sheets

--PRIOR ART--

PROBE CARD FOR TESTING A PATTERN FORMED ON A WAFER

CROSS REFERENCE TO RELATED APPLICATION

The present application claims priority to Korean Patent Application No. 10-2019-0123270, filed Oct. 4, 2019, the entire contents of which is incorporated herein for all purposes by this reference.

BACKGROUND OF THE INVENTION

Field of the Invention

The present invention relates to a probe card for testing a pattern formed on a wafer.

Description of the Related Art

A test for electrical characteristics of semiconductor devices is performed by approaching a semiconductor wafer to a probe card having a plurality of probes on a wiring board, and bringing the respective probes into contact with corresponding electrode pads on the semiconductor wafer. After the probes reach positions where the probes are brought into contact with the electrode pads, the semiconductor wafer may be further lifted by a predetermined height toward the probe card. This process is called overdrive, and the distance over which the wafer is further lifted by a predetermined height is called an overdrive amount.

Overdrive may be a process of elastically deforming the probes. Due to the overdrive, it is guaranteed that all the probes can make contact with the electrode pads even if there is a deviation in the height of the electrode pads or the height of the probes. In addition, during the overdrive, as the probes are elastically deformed, ends thereof which are to be brought into contact with the electrode pads are moved on the electrode pads to perform scrubbing. Due to such scrubbing, oxide films on the surfaces of the electrode pads can be removed with the result that contact resistance can be reduced.

With the recent trend toward miniaturization of semiconductor devices, the size and pitch of electrodes of the semiconductor device have been reduced, and this has led to a demand for reducing the thickness of the probes of the probe card. The probe card may include a guide plate for a probe card. The guide plate for the probe card supports the probes so that probe needles can be accurately positioned. As the size and pitch of the probes are reduced, there is a demand for reducing the size and pitch of through-holes of the guide plate.

Conventionally, a guide plate for a probe card made of a ceramic material has been used. The ceramic material has high mechanical strength and a coefficient of thermal expansion similar to that of a wafer.

A through-hole of the ceramic guide plate for the probe card is mainly formed by a machining method. Specifically, the through-hole of the ceramic guide plate for the probe card is formed using a drill or a laser.

However, using the machining method in forming the through-hole may result in difficulty in realizing a reduction in size and pitch, which is required in recent semiconductor technologies. That is, the machining method using the drill or the laser has limitations in realizing a reduction in size and pitch of the through-hole because the through-hole has to be formed in consideration of mechanical errors. In addition, the machining method using the drill or the laser may require high costs in forming the through-hole.

Meanwhile, there have also been studies on a guide plate for a probe card made of a resin material. However, the resin material has poor mechanical strength and the process for forming a through-hole is complicated.

In order to solve the disadvantages of the guide plate for the probe card made of the above ceramic material or resin material, there has also been development of a technology for manufacturing a guide plate for a probe card made of a silicon material.

In the case of the silicon material, a through-hole may be formed by an etching process. However, etching the silicon material may be problematic in that it is difficult to secure the mechanical strength of the guide plate for the probe card. Specifically, it is difficult to vertically form the through-hole in the silicon material during the etching process, and thus, the upper and lower inner diameters of the through-hole may be formed differently. This may cause the inner wall of the through-hole to be inclined. As a result, when forming a plurality of through-holes, the thickness of a partition wall separating adjacent through-holes may become thin, leading to a reduction in the mechanical strength of the guide plate for the probe card, which is problematic.

As such, although the silicon material is easily etched, a disadvantage is that the mechanical strength thereof is poor. In addition, as the partition wall between the through-holes becomes thin by the etching process of the silicon guide plate for the probe card, the risk of damage may increase when the inner walls of the through-holes are worn due to sliding friction with the probes. Therefore, there is a problem that it is difficult to secure wear resistance.

In addition, in order to vertically form the through-holes in the silicon material, a separate process (specifically, a coating process through sputtering) has to be performed. Therefore, forming the through-holes in the silicon guide plate for the probe card may require a lot of time and the process may be cumbersome.

FIG. 1 is a schematic view illustrating a probe card 100' according to the related art. The probe card 100' may be made of the above materials and may perform a burn-in test to ensure the reliability of chips.

The burn-in test may be conducted under a high temperature environment of 85° C. or 100° C. As a result, as the ambient temperature of the entire probe card may increase, and components of the probe card (e.g., a guide plate for the probe card (hereinafter, referred to as a 'guide plate')) may be thermally expanded.

As illustrated in FIG. 1, the probe card 100' according to the related art may include upper and lower guide plates 2 and 3 each of which has a through-hole for allowing insertion of probes 80 and an intermediate plate 4 provided between the upper and lower guide plates 2 and 3 and may have a structure in which the upper and lower guide plates 2 and 3 cover the intermediate plate 4.

During a burn-in test process by the probe card 100' according to the related art having such a structure, the upper and lower guide plates 2 and 3 and the intermediate plate 4 may be thermally expanded. In this case, the probe card 100' is problematic in that it is difficult for heat of the intermediate plate 4 with an elevated temperature to be dissipated due to the structure in which the upper and lower guide plates 2 and 3 cover the intermediate plate 4. As the upper and lower guide plates 2 and 3 and the intermediate plate 4 with elevated temperatures are thermally expanded, elongation or warpage may occur. This may result in a change in the positions of the through-holes and a reduction in the positional accuracy of front ends of the probes, thereby causing a problem of measurement error of the probe card 100'.

Documents of Related Art (Patent document 1) Japanese Patent No. 5337341

SUMMARY OF THE INVENTION

Accordingly, the present invention has been made keeping in mind the above problems occurring in the related art, and an objective of the present invention is to provide a probe card capable of realizing a reduction in pitch of probe insertion holes and forming vertical probe insertion holes with a single material.

In order to achieve the above objective, according to one aspect of the present invention, there is provided a probe card, including: a first plate; a second plate coupled to a lower portion of the first plate; an upper guide plate provided on an upper surface of the first plate; and a lower guide plate provided on a lower surface of the second plate; wherein at least one of the upper and lower guide plates may be made of an anodic oxide film material, and the upper and lower guide plates may be configured to have smaller areas than the first and second plates, so that surfaces of the first and second plates may be exposed.

Furthermore, the upper guide plate may be provided in an upper mounting area formed on the upper surface of the first plate, and the lower guide plate may be provided in a lower mounting area formed on the lower surface of the second plate.

Furthermore, the upper mounting area may be configured as a concave recess in the upper surface of the first plate, and the lower mounting area may be configured as a concave recess in the lower surface of the second plate.

Furthermore, the probe card may further include: a first through-hole formed in the first plate; and a second through-hole formed in the second plate at a position corresponding to the first through-hole, wherein a plurality of probes may be positioned in the first and second through-holes.

Furthermore, the probe card may further include a reinforcing plate coupled to at least a surface of each of the upper and lower guide plates.

Furthermore, the reinforcing plate may include a cutout hole for allowing the plurality of probes to be positioned therein.

Furthermore, the first and second plates may be made of a metal material.

Furthermore, the first and second plates may be made of a ceramic material.

Furthermore, the reinforcing plate may be made of a $Si_3N_4$ material.

Furthermore, the reinforcing plate may be made of a ceramic material.

Furthermore, at least one of the upper and lower guide plates may be configured by stacking a plurality of anodic oxide films.

According to another aspect of the present invention, there is provided a probe card, including: a first plate including a first through-hole; a second plate coupled to a lower portion of the first plate and including a second through-hole; an upper guide plate provided on an upper surface of the first plate and including an upper guide hole for allowing insertion of a probe; a lower guide plate provided on a lower surface of the second plate and including a lower guide hole for allowing insertion of the probe; an upper reinforcing plate provided between the first plate and the upper guide plate and including an upper cutout hole; and a lower reinforcing plate provided between the second plate and the lower guide plate and including a lower cutout hole, wherein the first and second plates may be positioned between the upper guide plate and the upper reinforcing plate, and the lower guide plate and the lower reinforcing plate so as to support the upper guide plate and the upper reinforcing plate, and the lower guide plate and the lower reinforcing plate, and the upper guide plate and the upper reinforcing plate, and the lower guide plate and the lower reinforcing plate may be configured to have smaller areas than the first and second plates, so that surfaces of the first and second plates may be exposed.

According to still another aspect of the present invention, there is provided a probe card, including: a first plate including a first through-hole; a second plate coupled to a lower portion of the first plate and including a second through-hole formed at a position corresponding to the first through-hole; an upper guide plate provided on an upper surface of the first plate and including an upper guide hole for allowing insertion of a probe; a lower guide plate provided on a lower surface of the second plate and including a lower guide hole for allowing insertion of the probe inserted through the upper guide hole; an upper reinforcing plate provided between the upper guide plate and the first plate and including an upper cutout hole for allowing the probe inserted through the upper guide hole of the upper guide plate to be positioned therein; and a lower reinforcing plate provided between the lower guide plate and the second plate and including a lower cutout hole for allowing the probe inserted through the upper guide hole of the upper guide plate to be positioned therein, wherein the upper guide plate, the upper reinforcing plate, the first plate, the second plate, the lower reinforcing plate, and the lower guide plate may be sequentially stacked; a first end of the probe may be inserted into and protrude from the upper guide hole of the upper guide plate, an intermediate body portion thereof may be positioned in the upper cutout hole, the first through-hole, the second through-hole, and the lower cutout hole, and a second end thereof may be inserted into and protrude from the lower guide hole of the lower guide plate; and the upper and lower guide plates and the upper and lower reinforcing plates may be configured to have smaller areas than the first and second plates, so that surfaces of the first and second plates may be exposed.

According to still another aspect of the present invention, there is provided a probe card, including: a first plate made of a metal material and including a first through-hole; a second plate coupled to a lower portion of the first plate, made of a metal material, and including a second through-hole; an upper guide plate provided on an upper surface of the first plate to have smaller area than the first plate and including an upper guide hole for allowing insertion of a probe; a lower guide plate provided on a lower surface of the second plate to have smaller area than the second plate and including a lower guide hole for allowing insertion of the probe; an upper reinforcing plate provided between the first plate and the upper guide plate and including an upper cutout hole for allowing the probe to be positioned therein; and a lower reinforcing plate provided between the second plate and the lower guide plate and including a lower cutout hole for allowing the probe to be positioned therein, wherein the upper guide plate, the upper reinforcing plate, the first plate, the second plate, the lower reinforcing plate, and the lower guide plate may be sequentially stacked, and surfaces of the first and second plates may be exposed.

In the present invention, by making the guide plate, which serves to guide front ends of the probes, with an anodic oxide film material, it is possible to realize a reduction in size and pitch of the probe insertion holes. In addition, due to the provision of the probe insertion holes, the guide plate substantially defining the probing area may be configured to have a smaller area than the first and second plates supporting the guide plate, thereby making it possible to realize a structure that is easy to handle.

In addition, by realizing a structure in which the upper and lower guide plates are provided in at least a partial area of the probe head, it is possible to achieve more uniform flatness of the upper and lower guide plates. As a result, it is possible to obtain an effect of improving positional accuracy of the probes in terms of the provision of the probes.

In addition, by providing the guide plate to have a smaller area than the entire area of the probe head, it is possible to realize a structure in which the surface of a structure supporting the guide plate is exposed, which can be effective in terms of heat dissipation when the structure supporting the guide plate is made of a metal material. Therefore, the probe card can be used more effectively in a burn-in test process.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

Figure 1:
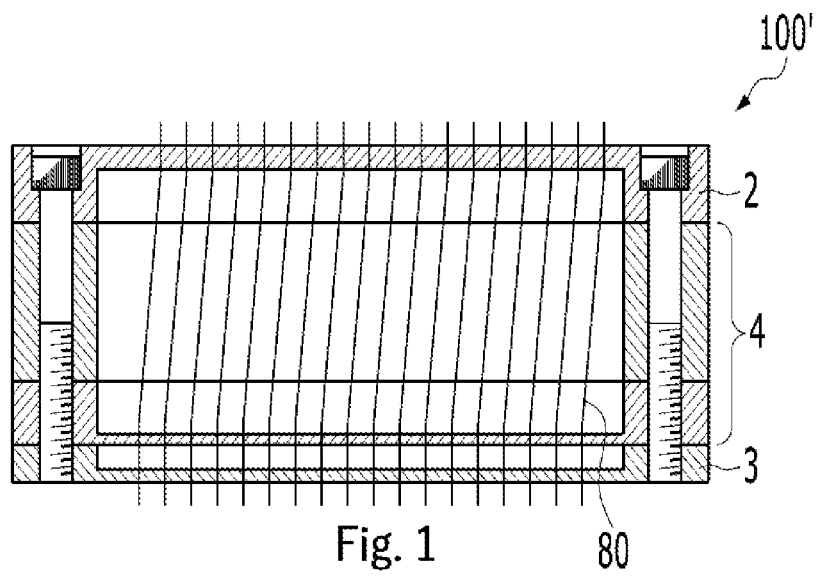
FIG. 1 is a view schematically illustrating a probe card according to the related art.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional teams and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention will be described with reference to cross-sectional views and/or perspective views which schematically illustrate ideal embodiments of the present invention. For explicit and convenient description of the technical content, sizes and widths of members and regions in the figures may be exaggerated. Therefore, variations from the shapes of the illustrations as a result, for example, of manufacturing techniques and/or tolerances, are to be expected.

In addition, a limited number of holes are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, exemplary embodiments of the present invention will be described in detail with reference to the accompanying drawings.

Figure 2:
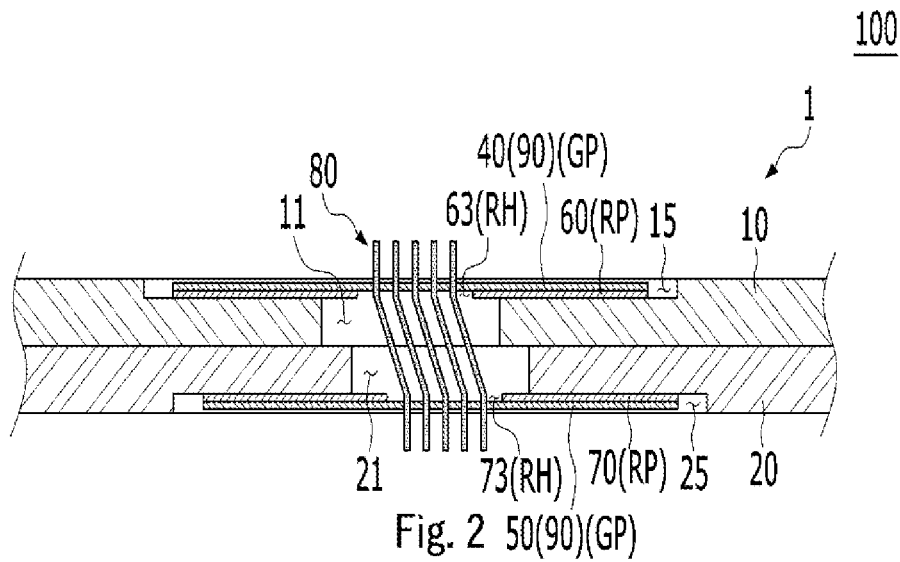
FIG. 2 is a view schematically illustrating a probe card according to an embodiment of the present invention.

FIG. 2 is a view schematically illustrating a probe head 1 of a probe card 100 according to an embodiment of the present invention. In this figure, for convenience of description, the number and size of a plurality of probes 80 are illustrated exaggeratedly. The probe card 100 according to the present invention may be manufactured by bolt fastening as an example. However, since this is only an example of a coupling means, hereinafter, in the drawings of FIGS. 2 to 8, bolts as a coupling means may be omitted.

As illustrated in FIG. 2, the probe card 100 according to the present invention may include a first plate 10, a second plate 20 coupled to a lower portion of the first plate 10, an upper guide plate 40 provided on an upper surface of the first plate 10, and a lower guide plate 50 provided on a lower surface of the second plate 20. In this case, at least one of the upper and lower guide plates 40 and 50 may be made of an anodic oxide film material, and the upper and lower guide plates 40 and 50 may be smaller in areas than the first and second plates 10 and 20 so that the surfaces of the first and second plates 10 and 20 may be exposed.

The probe card 100 may be configured so that a guide plate GP including the first and second plate 10 and 20 and the upper and lower guide plates 40 and 50, and a plurality of probes 80 are combined to constitute the probe head 1, which is a front part of the probe card 100. In the present invention, a reinforcing plate RP including upper and lower reinforcing plates 60 and 70 may be additionally provided.

Figure 3:
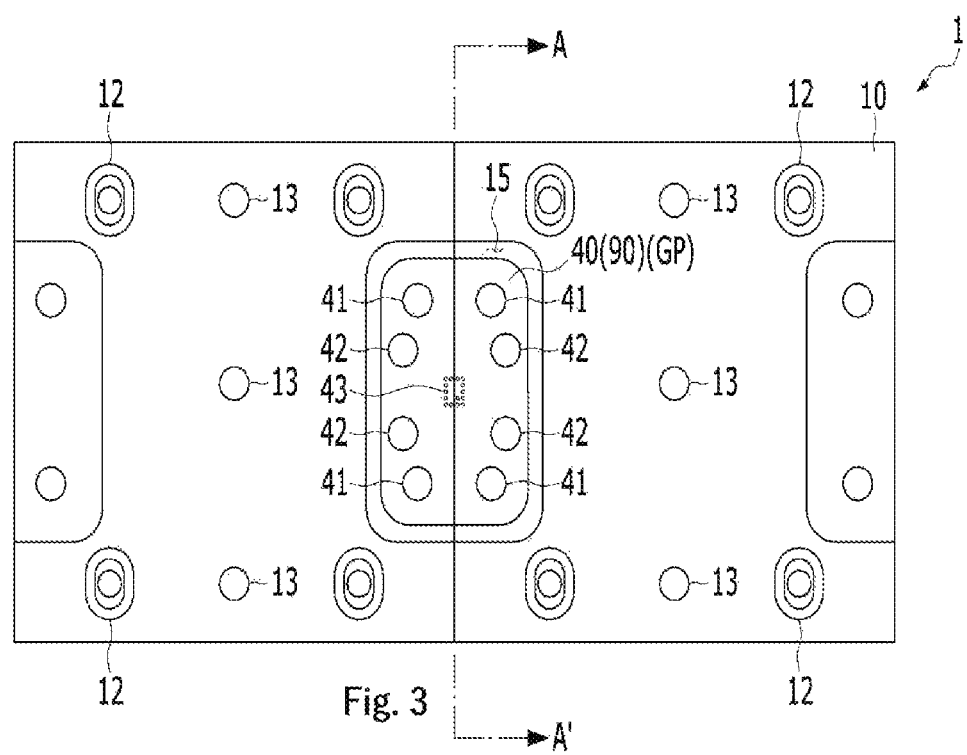
FIG. 3 is a view illustrating the probe card according to the present invention when viewed from above.

FIG. 3 is a view schematically illustrating the probe head 1 when viewing the probe card 100 according to the present invention from above. As illustrated in FIG. 3, the upper guide plate 40 may have a smaller area than the first plate 10. Therefore, of the surfaces of the first plate 10, the remaining surfaces except for the upper surface on which the upper guide plate 40 is provided may be exposed. The upper and lower guide plates 40 and 50 may be formed in shapes corresponding to each other, and may include the same configuration (e.g., a guide hole for allowing insertion of the plurality of probes 80). Therefore, when viewed from above, the probe card 100 may be implemented as illustrated in FIG. 3. In other words, in the present invention, the upper and lower guide plates 40 and 50 may have smaller areas than the first and second plates 10 and 20 so that of the first and second plates 10 and 20, the remaining surfaces except for the upper and lower surfaces on which the upper and lower guide plates 40 and 50 are provided may be exposed.

With such a structure, handling may be facilitated. Specifically, when ends of the plurality of probes 80 first inserted through the guide holes of the upper and lower guide plates 40 and 50 are front ends of the probes 80, the upper and lower guide plates 40 and 50 may serve to guide the tip portions of the probes 80. Therefore, the upper and lower guide plates 40 and 50 may define probing areas of the probe card 100. The first and second plates 10 and 20 supporting the upper and lower guide plates 40 and 50 may define the entire area of the probe head 1. Therefore, the areas occupied by the upper and lower guide plates 40 and 50 over the entire area of the probe head 1 may be the probing areas.

Since the upper and lower guide plates 40 and 50 may have smaller areas than the first and second plates 10 and 20, a problem in which the probing areas are broken or damaged may be minimized. Therefore, handling may be facilitated.

Conventionally, upper and lower guide plates 2 and 3 defining probing areas define the entire area of a probe head. Referring again to FIG. 1, in the probe head according to the related art, an unnecessary area other than the probing areas in which a plurality of probes 80 are provided and performing a practical probing process is included in the probing areas thereby defining the entire area of the probe head. This causes a problem in that handling is difficult because even if a portion of the probe head is damaged, this means that the probing areas are damaged.

However, in the present invention, the upper and lower guide plates 40 and 50 defining the probing areas have smaller areas than the first and second plates 10 and 20 defining the entire area of the probe head 1, so that the risk of damage may be lowered and handling may be facilitated.

In addition, a relatively uniform flatness may be achieved compared to a structure in which the upper and lower guide plates 2 and 3 according to the related art define the entire area of the probe head.

The upper and lower guide plates 2 and 3 according to the related art define the entire area of the probe head with larger areas than the upper and lower guide plates 40 and 50 according to the present invention, so it is difficult to achieve uniform flatness. When the flatness of the upper and lower guide plates 2 and 3 is not uniform, the positions of the probes 80 may be changed, resulting in an error in wafer pattern test.

However, in the present invention, since the upper and lower guide plates 40 and 50 in which the probes 80 are inserted have smaller areas than the probe head 1, it may be easier to achieve uniform flatness thereof.

Hereinafter, the configuration of the probe card 100 according to the present invention will be described in detail with reference to FIGS. 2 and 3.

As illustrated in in FIG. 2, the first plate 10 may serve to support, on the upper surface thereof, the upper guide plate 40 that serves to guide the front ends of the probes 80. The first plate 10 may have a larger area than the upper guide plate 40 and may support the upper guide plate 40 in at least a partial area of the upper surface thereof.

The first plate 10 may include an upper mounting area 15 for allowing mounting of the upper guide plate 40. In this case, the upper mounting area 15 is formed on the upper surface of the first plate 10, and the position thereof is not limited to any one area of the upper surface of the first plate 10. In the present invention, as an example, as illustrated in FIG. 2, the upper mounting area 15 may be formed at the center of the first plate 10 with respect to a central line vertically disposed on a plane of the first plate 10.

The upper guide plate 40 may be provided in the upper mounting area 15 formed on the upper surface of the first plate 10. In this case, the upper mounting area 15 may be configured as a concave recess in the upper surface of the first plate 10. However, since this is illustrated and described as an example, the shape of the upper mounting area 15 is not limited thereto. Therefore, the upper mounting area 15 may be formed in a suitable shape to allow the upper guide plate 40 to be provided on the upper surface of the first plate 10 more stably.

The first plate 10 may more stably support the upper guide plate 40 on the upper surface thereof by the upper mounting area 15. In addition, when the upper guide plate 40 is provided on the upper surface of the first plate 10, the upper guide plate 40 may be easily guided to a desired position by the upper mounting area 15.

The first plate 10 may include a first through-hole 11. The first through-hole 11 may be provided to allow the plurality of probes 80 inserted through an upper guide hole 43 of the upper guide plate 40, which will be described later, to be positioned therein. Therefore, the first through-hole 11 may be formed at a position corresponding to a position where the upper guide hole 43 of the upper guide plate 40 is formed, to allow the plurality of probes 80 to be positioned therein, and in consideration of the elastic deformation of the plurality of probes 80, may have an inner diameter capable of receiving the elastic deformation.

As illustrated in FIG. 2, the second plate 20 may be coupled to the lower portion of the first plate 10.

The second plate 20 may serve to support, on the lower surface thereof, the lower guide plate 50 that serves to guide the front ends of the probes 80. In this case, the second plate 20 may have an area corresponding to the first plate 10. Therefore, the second plate 20 may support the lower guide plate 50 in at least a portion of the lower surface thereof.

The second plate 20 may include a lower mounting area 25 formed on the lower surface thereof to allow mounting of the lower guide plate 50. In this case, the lower mounting area 25 is not limited to any one area of the lower surface of the second plate 20.

The second plate 20 may be provided in the same shape as the first plate 10 described with reference to FIGS. 2 and 3 above, and may be coupled to the lower portion of the first plate 10 so that the second plate 20 and the first plate 10 are inverted from each other. Therefore, the lower mounting area 25 of the second plate 20 may be formed in the same shape as the upper mounting area 15 of the first plate 10 at a position inverted from that of the upper mounting area 15 of the first plate 10.

The lower guide plate 50 may be provided in the lower mounting area 25 formed on the lower surface of the second plate 20. In this case, the lower mounting area 25 may be configured as a concave recess in the lower surface of the second plate 20. However, since this is illustrated and described as an example, the shape of the lower mounting area 25 is not limited thereto.

When the lower guide plate 50 is provided on the lower surface of the second plate 20, the lower guide plate 50 may be easily guided to a desired position by the lower mounting area 25.

As illustrated in FIG. 2, the first plate 10 and the second plate 20 may be inverted from each other with respect to a contact interface between the first and second plates 10 and 20. Therefore, the upper mounting area 15 of the first plate 10 in which the upper guide plate 40 is provided and the lower mounting area 25 of the second plate 20 in which the lower guide plate 50 is provided may be formed at positions inverted from each other. In addition, the upper guide plate 40 and the lower guide plate 50 provided in the respective upper and lower mounting areas 15 and 25 may be provided at positions inverted from each other. However, since the shapes of the first and second plates 10 and 20 inverted from each other are illustrated and described as an example in the present invention, the shapes of the first and second plates 10 and 20 are not limited thereto.

The second plate 20 may include a second through-hole 21 corresponding to the first through-hole 11 of the first plate 10. This allows the probes 80 positioned in the first through-hole 11 to be also positioned in the second through-hole 21. The second through-hole 21 may be formed to have the same inner diameter as the first through-hole 11. However, the present invention is not limited thereto, and for example, the second through-hole 21 may be formed with a smaller inner diameter than the first through-hole 11 at a position corresponding to the first through-hole 11. In another example, the second through-hole 21 may be formed with an inner diameter capable of securing a free space that allows, when the plurality of probes positioned in the first through-hole 11 is elastically deformed, the elastic deformation to be received therein.

On the contrary, the second through-hole 21 may be formed with a larger inner diameter than the first through-hole 11 at a position corresponding to the first through-hole 11.

The plurality of probes 80 may be inserted through the upper guide hole 43 of the upper guide plate 40 and into and through a lower guide hole 53 of the lower guide plate 50, so that the plurality of probes 80 may be positioned inside the first and second through-holes 11 and 12. Therefore, the probe card 100 according to the present invention may be configured with the first through-hole 11 formed in the first plate 10 and the second through-hole 11 formed in the second plate 20 at a position corresponding to the first through-hole 11 so that the plurality of probes 80 is positioned inside the first and second through-holes 11 and 21.

The upper guide plate 40 may be provided in the upper mounting area 15 formed on the upper surface of the first plate 10, and the lower guide plate 50 may be provided in the lower mounting area 25 formed on the lower surface of the second plate 20.

The upper guide plate 40 provided on the upper surface of the first plate 10 may include the upper guide hole 43 for allowing insertion of the plurality of probes 80. In addition, the lower guide plate 50 provided on the lower surface of the second plate 20 may include the lower guide hole 53 for allowing insertion of the probes 80 inserted through the upper guide hole 43 of the upper guide plate 40.

The upper and lower guide holes 43 and 53 of the upper and lower guide plates 40 and 50 may be formed correspondingly in the same positions so as to facilitate insertion of the probes 80.

At least one of the upper and lower guide plates 40 and 50 may be made of an anodic oxide film material.

The anodic oxide film is a film formed by anodizing a metal that is a base material, and pores are pores formed in the anodic oxide film during the process of anodizing the metal to form the anodic oxide film. For example, in a case where the metal as the base material is aluminum (Al) or an aluminum alloy, the anodization of the base material forms an anodic oxide film consisting of anodized aluminum ($Al_2O_3$) on the surface of the base material. The anodic oxide film formed as described above is divided into a barrier layer in which pores are not formed and a porous layer in which pores are formed. The barrier layer is positioned on top of the base material, and the porous layer is positioned on top of the barrier layer. In a state in which the anodic oxide film having the barrier layer and the porous layer is formed on the surface of the base material, when the base material is removed, only the anodic oxide film consisting of anodized aluminum ($Al_2O_3$) remains. The resulting anodic oxide film has pores that have a uniform diameter, are formed in a vertical shape, and have a regular arrangement. Therefore, when the barrier layer is removed, the anodic oxide film has a structure in which the pores vertically pass therethrough from top to bottom.

The anodic oxide film has a coefficient of thermal expansion of 2 to 3 ppm/° C. This may result in less deformation due to temperature. As an example, the probe card 100 according to the present invention may perform an electronic die sorting (EDS) process for testing electrical characteristics of each chip constituting a wafer. The EDS process may be performed under a high temperature environment. Therefore, as the overall temperature of the probe card 100 increases, the upper and lower guide plates 40 and 50 may be thermally expanded. In this case, when at least one of the upper and lower guide plates 40 and 50 is made of the anodic oxide film material, such deformation may not easily occur.

The both upper and lower guide plates 40 and 50 may be made of the anodic oxide film material so that a problem of reducing positional accuracy of the upper and lower guide holes 43 and 53 may be prevented.

In the upper and lower guide plates 40 and 50 made of the anodic oxide film material, the upper and lower guide holes 43 and 53 may be formed by an etching process. In the case of the anodic oxide film material, the upper and lower guide holes 43 and 53 may be vertically formed by the etching process. This may make it possible to realize a reduction in size and pitch of the upper and lower guide holes 43 and 53.

The reinforcing plate RP may be coupled to at least a surface of each of the upper and lower guide plates 40 and 50. In the present invention, as an example, the reinforcing plate RP may be provided on each of a lower surface of the upper guide plate 40 and an upper surface of the lower guide plate 50. This may make it possible to improve mechanical strength of the upper and lower guide plates 40 and 50.

When the reinforcing plate RP is provided on at least the surface of each of the upper and lower guide plates 40 and 50, the respective reinforcing plate RP may be composed of an upper reinforcing plate 60 coupled to the surface of the upper guide plate 40 and a lower reinforcing plate 70 coupled to the surface of the lower guide plate 50.

The reinforcing plate RP may include a cutout hole RH for allowing the plurality of probes 80 to be positioned therein. In this case, the respective cutout holes RH may be composed of an upper cutout hole 63 formed in the upper reinforcing plate 60, and a lower cutout hole 73 formed in the lower reinforcing plate 70.

The cutout hole RH may be formed in a shape having a quadrangular cross-section as an example, but the shape thereof is not limited thereto. For example, the cutout hole RH may be formed in a shape having a circular cross-section.

The cutout hole RH of the reinforcing plate RP may be formed to have a larger area than that each of upper and lower guide hole existence areas so that the plurality of probes 80 is positioned in the cutout hole RH, the upper and lower guide hole existence areas being respectively defined by a plurality of upper and lower guide holes formed in the upper and lower guide plates 40 and 50.

By providing on the surface of each of the upper and lower guide plates 40 and 50 the reinforcing plate RP having the cut groove RH, a structure in which the surface of each of the upper and lower guide plates 40 and 50 is supported by the reinforced plate RP may be formed.

Since the reinforcing plate RP may serve to support the upper and lower guide plates 40 and 50, the reinforcing plate RP may be made of a material having high mechanical strength. Specifically, for example, the reinforcing plate RP may be made of a $Si_3N_4$ material. In another example, the reinforcing plate RP may be made of a ceramic material. In these cases, the cut grooves RH may be formed by a method suitable for each material.

The reinforcing plate RP and the upper and lower guide plates 40 and 50 may be coupled to each other by bonding, or molding in which the top of the stacked upper guide plate 40 and upper reinforcing plate 60 and the top of the stacked lower guide plate 50 and lower reinforcing plate 70 are molded.

With such a structure, the present invention can have an advantage in terms of mechanical strength while realizing a reduction in size and pitch of the upper and lower guide holes 43 and 53 of in the upper and lower guide plates 40 and 50 made of an anodic oxide film material.

The upper and lower guide plates 2 and 3 according to the related art are made of a ceramic material having an advantage in terms of mechanical strength. However, in the case of the ceramic material, a laser or a drill is used as a method for forming probe insertion holes for allowing insertion of the probes 80, and thus, there is a problem in that it is difficult to realize a reduction in size and pitch of the probe insertion holes.

Alternatively, the upper and lower guide plates 2 and 3 according to the related art are made of a resin material. In the case of the resin material, an etching process is possible, making it possible to realize a reduction in pitch of the probe insertion holes, but there is a contradictory problem of warpage deformation and wear upon friction with the probes 80 due to low mechanical strength.

Alternatively, the upper and lower guide plates 2 and 3 according to the related art are made of a silicon material. Also, in the case of the silicon material, an etching process is possible, making it possible to realize a reduction in pitch of the probe insertion holes, but there is a contradictory problem in that it is difficult to vertically form the probe insertion holes. In other words, in the case of the silicon material, the probe insertion holes may be formed in a tapered shape. This causes a problem in that the inner walls of the probe insertion holes are worn upon friction with the probes 80. Therefore, there is a disadvantage in that the overall mechanical strength of the silicon upper and lower guide plates 2 and 3 is low.

However, in the present invention, by providing the reinforcing plate RP on at least the surface of each of the upper and lower guide plates 40 and 50 made of an anodic oxide film material, it may be possible to realize a reduction in size and pitch of the upper and lower guide holes 43 and 53, while exhibiting an effect of excellent durability due to high mechanical strength.

Hereinafter, the structure of the probe head 1 according to the present invention will be described in detail with reference to FIGS. 4 and 5.

Figure 4:
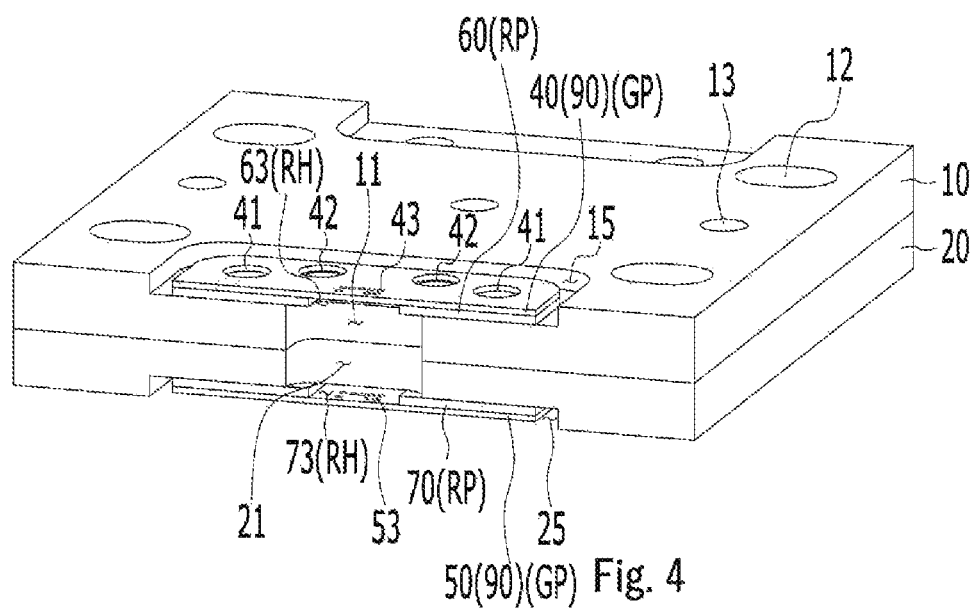
FIG. 4 is a perspective view when viewed from a surface cut along line A-A' of FIG. 3.
Figure 5:
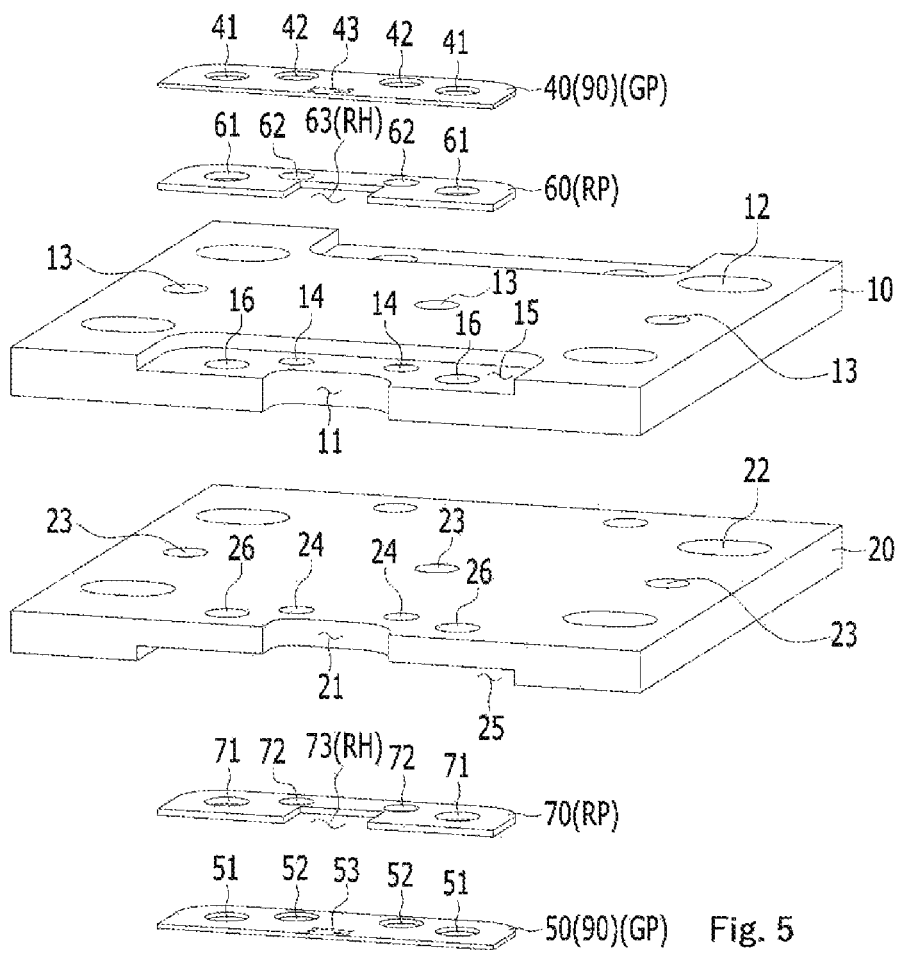
FIG. 5 is an exploded perspective view of FIG. 4.

FIG. 4 is a perspective view schematically illustrating the configuration of the probe head 1 according the present invention when viewed from a surface cut along line A-A' of FIG. 3, and FIG. 5 is an exploded perspective view of FIG. 4. In these figures, the plurality of probes 80 is omitted.

As illustrated in FIG. 4, the probe card 100 according to the present invention may include the first plate 10 having the first through-hole 11, the second plate 20 coupled to the lower portion of the first plate 10 and having the second through-hole 21, the upper guide plate 40 provided on the upper surface of the first plate 10 and having the upper guide hole 43 for allowing insertion of the probes 80, the lower guide plate 50 provided on the lower surface of the second plate 20 and having the lower guide hole 53 for allowing insertion of the probes 80, the upper reinforcing plate 60 provided between the first plate 10 and the upper guide plate 40 and having the upper cutout hole 63, and the lower reinforcing plate 70 provided between the second plate 20 and the lower guide plate 50 and having the lower cutout hole 73. These may constitute the probe head 1.

As illustrated in FIG. 4, the first and second plates 10 and 20 may be positioned between the upper guide plate 40 and the upper reinforcing plate 60 and the lower guide plate 50 and the lower reinforcing plate 70 and may support the upper guide plate 40 and the upper reinforcing plate 60 and the lower guide plate 50 and the lower reinforcing plate 70.

The upper guide plate 40 and the upper reinforcing plate 60 and the lower guide plate 50, and the lower reinforcing plate 70 may have smaller areas than the first and second plates 10 and 20, so that the surfaces of the first and second plates 10 and 20 may be exposed.

As illustrated in FIG. 4, the second plate 20 may be provided on the lower portion of the first plate 10 in a shape inverted from the shape of the first plate 10.

The upper guide plate 40, and the upper reinforcing plate 60 that is coupled to the surface (e.g., the lower surface) of the upper guide plate 40 may be provided in the upper mounting area 15 of the first plate 10.

The lower guide plate 50 and the lower reinforcing plate 70 that is coupled to the surface (e.g., the upper surface) of the lower guide plate 50 may be provided in the lower mounting area 25 of the second plate 20.

The upper guide plate 40 and the upper reinforcing plate 60 and the lower guide plate 50 and the lower reinforcing plate 70, which are provided in the respective upper and lower mounting areas 15 and 25 of the first and second plates 10 and 20 provided in a shape inverted from each other, may have a structure stacked in opposite directions.

Specifically, as illustrated in FIG. 4, the upper guide plate 40 and the upper reinforcing plate 60 may be sequentially stacked in the upper mounting area 15 of the first plate 10. The lower guide plate 50 and the lower reinforcing plate 70 may be sequentially stacked in the lower mounting area 25 of the second plate 20 in a direction opposite to a direction in which the upper guide plate 40 and the upper reinforcing plate 60 are stacked.

As illustrated in FIG. 4, the upper and lower reinforcing plates 60 and 70 may support the upper and lower guide plates 40 and 50 by the remaining areas except for the upper and lower cutout holes 63 and 73.

With such a structure, the upper and lower reinforcing plates 60 and 70 respectively support the upper and lower guide plates 40 and 50 stacked thereon, thereby improving mechanical strength. In other words, in the present invention, with a structure in which the upper guide plate 40 and the upper reinforcing plate 60 provided in the upper mounting area 15, and the lower guide plate 50 and the lower reinforcing plate 70 provided in the lower mounting area 25 are stacked in opposite directions, it may be possible to improve mechanical strength of the upper guide plate 40 and the lower guide plate 50 guiding sliding movement of the probes 80. An anodic oxide film material having a small thickness may be more efficient in forming the upper and lower guide holes 43 and 53 vertically. In addition, the anodic oxide film material may be a material suitable for a reduction in size and pitch of the upper and lower guide holes 43 and 53. In the present invention, by forming a structure in which at least one of the upper and lower guide plates 40 and 50 is made of the anodic oxide film material, and the upper and lower reinforcing plates 60 and 70 are coupled to the surfaces of the upper and lower guide plates 40 and 50, it may be possible to provide fine probes 80 with a fine pitch arrangement. At the same time, it may be possible to achieve excellent durability in which warpage deformation is prevented.

As illustrated in FIG. 4, the first and second plates 10 and 20 may be positioned between the upper guide plate 40 and the upper reinforcing plate 60 provided in a stacked structure in the upper mounting area 15, and the lower guide plate 50 and the lower reinforcing plate 70 provided in a stacked structure in the lower mounting area 25. With such a structure, the first and second plates 10 and 20 may support the upper guide plate 40 and the upper reinforcing plate 60, and the lower guide plate 50 and the lower reinforcing plate 70.

As illustrated in FIG. 4, the upper and lower guide plates 40 and 50 and the upper and lower reinforcing plates 60 and 70 may be configured to have smaller areas than the first and second plates 10 and 20, so that the surfaces of the first and second plates 10 and 20 may be exposed. Therefore, the first and second plates 10 and 20 may be configured to have larger areas than the upper and lower guide plates 40 and 50 and the upper and lower reinforcing plates 60 and 70 so as to support the upper and lower guide plates 40 and 50 and the upper and lower reinforcing plates 60 and 70. This may make it possible to further improve mechanical strength of the probing areas defined by the upper and lower guide plates 40 and 50 and the upper and lower reinforcing plates 60 and 70.

In addition, the upper and lower guide plates 40 and 50 and the upper and lower reinforcing plates 60 and 70 may be provided in at least a partial area of the probe head 1 rather than the entire area, so that the upper and lower guide plates 40 and 50 may have a relatively uniform flatness. As a result, it may be possible to prevent a problem of positional deformation of the upper and lower guide holes 43 and 53.

The first and second plates 10 and 20 according to the present invention may be coupled to each other by bolt fastening, and may be coupled to the guide plate GP and the reinforcing plate RP coupled to each other by molding or bonding (specifically, the upper guide plate 40 and the upper reinforcing plate 60 coupled to each other by molding or bonding, and the lower guide plate 50 and the lower reinforcing plate 70 coupled to each other by molding or bonding), through the reinforcing plate RP. The coupling structure of the first and second plates 10 and 20, and the upper and lower guide plates 40 and 50 and the upper and lower reinforcing plates 60 and 70 according to the present invention will be described in detail with reference to FIG. 5.

Prior to the detailed description, first to sixth guide pin insertion holes 16, 26, 41, 61, 51, and 71 which will be described below are configured to separate guide pin insertion holes formed in the respective plates, and are not limited to the sequential coupling order of the guide pin insertion holes. In addition, first to sixth main bolt fastening holes 14, 24, 42, 62, 52, and 72 are configured to separate main bolt fastening holes formed in the respective plates, and are limited to the sequential coupling order of the main bolt fastening holes.

As illustrated in FIG. 5, the first plate 10 may include an upper coupling hole 12, and an upper guide pin insertion hole 13 for allowing the second plate 20 to be easily provided on the lower portion of the first plate 10 in alignment with the first plate 10.

A means for coupling the first and second plates 10 and 20 in a state in which the second plate 20 is provided on the lower portion of the first plate 10 may be provided in the upper coupling hole 12. As an example, the coupling means may be a bolt.

The upper guide pin insertion hole 13 may allow a guide pin to be positioned therein, the guide pin allowing the first and second plates 10 and 20 to be easily aligned before the first and second plates 10 and 20 are coupled to each other by the bolt through the upper coupling hole 12.

The second plate 20 may include a lower coupling hole 22 and a lower guide pin insertion hole 23. The bolt positioned in the upper coupling hole 12 may be positioned in the lower coupling hole 22, and the guide pin inserted through the upper guide pin insertion hole 13 may be positioned in the lower guide pin insertion hole 23. The guide pin may be removed before the first and second plates 10 and 20 are coupled to each other by the bolt through the upper and lower coupling holes 12 and 22.

The positions, shapes, and numbers of the upper and lower coupling holes 12 and 22 and the upper and lower guide pin insertion holes 13 and 23 illustrated in FIG. 5 are illustrated as an example, and thus the positions, shapes, and numbers thereof are not limited thereto.

The first and second plates 10 and 20 according to the present invention may be coupled to each other by the bolt after shifting from an aligned position to a misaligned position when the guide plate GP and the reinforcing plate RP that are coupled to each other by molding or bonding are provided in the upper and lower mounting areas 15 and 25. This may be to elastically deform the plurality of probes 80 vertically inserted in a straight shape through the upper and lower guide holes 43 and 53.

Therefore, as illustrated in FIG. 5, the upper coupling hole 12 of the first plate 10 may be formed to have a larger inner diameter than the lower coupling hole 22 of the second plate 20. When the upper coupling hole 12 has a larger inner diameter than the lower coupling hole 22, the plurality of probes 80 may be inserted through the upper and lower guide holes 43 and 53, and then at least one of the first and second plates 10 and 20 may be positionally shifted to cause the upper and lower guide holes 43 and 53 to be misaligned with each other, and finally the first and second plates 10 and 20 may be coupled to each other by the bolt. In this case, the guide pin positioned in the upper and lower guide pin insertion holes 13 and 23 may be in a removed state.

On the other hand, the lower coupling hole 22 of the second plate 20 may be formed to have a larger inner diameter than the upper coupling hole 12. Also, in this case, the first and second plates 10 and 20 may be coupled to each other by the bolt by inserting the plurality of probes 80 through the upper and lower guide holes 43 and 53, and then positionally shifting at least one of the first and second plates 10 and 20 to cause the upper and lower guide holes 43 and 53 to be misaligned with each other.

As illustrated in FIG. 5, the first plate 10 may include the first guide pin insertion hole 16 for allowing easy alignment of the first plate 10 with the upper guide plate 40 and the upper reinforcing plate 60.

The upper guide plate 40 may include the third guide pin insertion hole 41 formed at a position corresponding to the first guide pin insertion hole 16 of the first plate 10, and the upper reinforcing plate 60 may include the fourth guide pin insertion hole 61 formed at a position corresponding to the third guide pin insertion hole 41. In other words, in the upper mounting area 15 of the first plate 10, the first guide pin insertion hole 16 may be formed at a position corresponding to the third guide pin insertion hole 41 of the upper guide plate 40 and the fourth guide pin insertion hole 61 of the upper reinforcing plate 60.

Therefore, the respective guide pin insertion holes may be formed in the first plate 10, the upper guide plate 40, and the upper reinforcing plate 60 at positions corresponding to each other.

In addition, the second plate 20 may include the second guide pin insertion hole 26 for allowing easy alignment of the second plate 20 with the lower guide plate 50 and the lower reinforcing plate 70.

The lower guide plate 50 include the fifth guide pin insertion hole 51 formed at a position corresponding to the second guide pin insertion hole 26 of the second plate 20, and the lower reinforcing plate 70 may include the sixth guide pin insertion hole 71 formed at a position corresponding to the fifth guide pin insertion hole 51. In other words, in the lower mounting area 25 of the second plate 20, the second guide pin insertion hole 26 may be formed at a position corresponding to the fifth guide pin insertion hole 51 of the lower guide plate 50 and the sixth guide pin insertion hole 71 of the lower reinforcing plate 70.

Therefore, the respective guide pin insertion holes may be formed in the second plate 20, the lower guide plate 60, and the lower reinforcing plate 70 at positions corresponding to each other.

As illustrated in FIG. 5, the first guide pin insertion hole 16 of the first plate 10 and the second guide pin insertion hole 26 of the second plate 20 may be provided at positions corresponding to each other. Therefore, the first to sixth guide pin insertion holes 16 to 71 may be formed at positions corresponding to each other. This may allow the first and second plates 10 and 20, the upper and lower guide plates 40 and 50, and the upper and lower reinforcing plates 60 and 70 to be aligned with each other by at least one guide pin.

As illustrated in FIG. 5, the present invention may have a structure in which the upper guide plate 40, the upper reinforcing plate 60, the first plate 10, the second plate 20, the lower reinforcing plate 70, and the lower guide plate 50 are sequentially stacked. Therefore, the guide pin may be inserted through the third guide pin insertion hole 41, sequentially positioned in the fourth guide pin insertion hole 61, the first guide pin insertion hole 16, the second guide pin insertion hole 26, and the sixth guide pin insertion hole 71, and inserted into the fifth guide pin insertion hole 51. This may allow the upper guide plate 40, the upper reinforcing plate 60, the first plate 10, the second plate 20, the lower reinforcing plate 70, and the lower guide plate 50 to be temporarily aligned with each other. As a result, it may be easier to vertically insert the plurality of probes 80.

The first plate 10 may include the first main bolt fastening hole 14 for allowing coupling of the first plate 10, the upper guide plate 40, and the upper reinforcing plate 60 by a bolt in a state in which the upper guide plate 40 and the upper reinforcing plate 60 are provided in the upper mounting area 15.

The second plate 20 may include the second main bolt fastening hole 24 for allowing coupling of the second plate 20, the lower guide plate 50, and the lower reinforcing plate 70 by a bolt in a state in which the lower guide plate 50 and the lower reinforcing plate 70 are provided in the lower mounting area 25.

The first and second main bolt fastening holes 14 and 24 respectively provided in the first and second plates 10 and 20 may be formed at positions corresponding to each other.

The upper guide plate 40 provided in the upper mounting area 15 of the first plate 10 may include the third main bolt fastening hole 42 formed at a position corresponding to the first main bolt fastening hole 14 of the first plate 10. In addition, the upper reinforcing plate 60 may include the fourth main bolt fastening hole 62 formed at a position corresponding to the first main bolt fastening hole 14. Therefore, the first main bolt fastening hole 14 of the upper mounting area 15 of the first plate 10 may be formed at a position corresponding to the third main bolt fastening hole 42 of the upper guide plate 40 and the fourth main bolt fastening hole 62 of the upper reinforcing plate 60.

When the upper guide plate 40 is made of an anodic oxide film material, the third main bolt fastening hole 42 may be formed to have a larger inner diameter than the first and fourth main bolt fastening holes 14 and 62. In other words, when the upper guide plate 40 is made of the anodic oxide film material, in order to prevent a problem of damage to the upper guide plate 40 due to a bolt positioned in the third main bolt fastening hole 42, the third main bolt fastening hole 42 may be formed to have a larger inner diameter than the first and fourth main bolt fastening holes 14 and 62. The first main bolt fastening hole 14 of the first plate 10 and the fourth main bolt fastening hole 62 of the upper reinforcing plate 60 are may be holes in which a bolt is substantially screwed to couple the upper guide plate 40 and the upper reinforcing plate 60 to the first plate 10. Therefore, the first main bolt fastening hole 14 and the fourth main bolt fastening hole 62 may be formed to have the same inner diameter suitable for a bolt to be provided.

The lower guide plate 50 provided in the lower mounting area 25 of the second plate 20 may include the fifth main bolt fastening hole 52 formed at a position corresponding to the second main bolt fastening hole 24 of the second plate 20. In addition, the lower reinforcing plate 70 may include the sixth main bolt fastening hole 72 formed at a position corresponding to the second main bolt fastening hole 24. Therefore, the second main bolt fastening hole 24 of the lower mounting area of the second plate 20 may be formed at a position corresponding to the fifth main bolt fastening hole 52 of the lower guide plate 50 and the sixth main bolt fastening hole 72 of the lower reinforcing plate 70.

When the lower guide plate 50 is made of an anodic oxide film material, the fifth main bolt fastening hole 52 may be formed to have a larger inner diameter than the second and sixth main bolt fastening holes 24 and 72. This may be to prevent a problem of damage to the lower guide plate 50 due to a bolt when the lower guide plate 50 is made of the anodic oxide film material. The second main bolt fastening hole 24 of the second plate 20 and the fifth main bolt fastening hole 52 of the lower reinforcing plate 70 may be holes in which a bolt is substantially screwed. Therefore, the second main bolt fastening hole 24 and the fifth main bolt fastening hole 52 may be formed to have the same inner diameter suitable for a bolt to be provided.

In the present invention, as an example, a bolt inserted through the third main bolt fastening hole 42 of the upper guide plate 40 may be screwed in the fourth main bolt fastening hole 62 of the upper reinforcing plate 60 and in the first main bolt fastening hole 14 of the first plate 10 to thereby couple the first plate 10, the upper guide plate 40, and the upper reinforcing plate 60 to each other.

In addition, a bolt inserted through the fifth main bolt fastening hole 52 of the lower guide plate 50 may be screwed in the sixth main bolt fastening hole 72 of the lower reinforcing plate 70 and the second main bolt fastening hole 24 of the second plate 20 to thereby couple the second plate 20, the lower guide plate 50, and the lower reinforcing plate 70 to each other.

Hereinafter, the guide plate GP defining a substantial probing area according to the present invention and the reinforcing plate RP coupled to the guide plate GP will be described in detail with reference to FIGS. 6A and 6B.

Figure 6A:
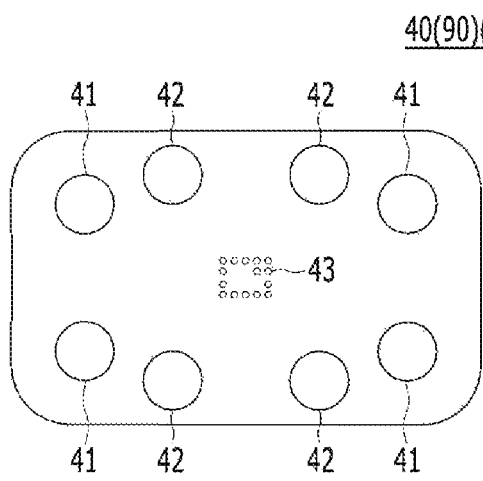
FIGS. 6A and 6B are views illustrating a guide plate and a reinforcing plate according to the present invention when viewed from above.
Figure 6B:
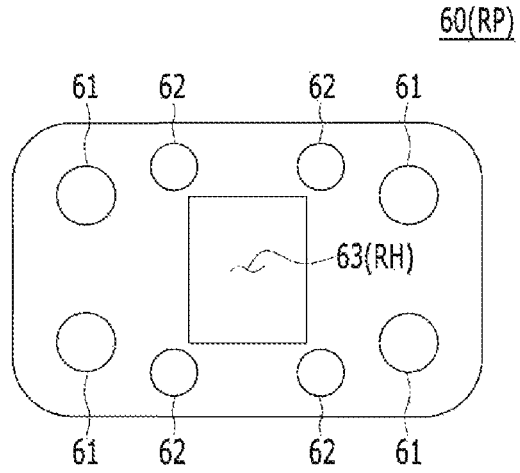

FIG. 6A is a view illustrating the guide plates GP according to the present invention when viewed from above, and FIG. 6B is a view illustrating the reinforcing plate RP when viewed from above. The guide plate GP and the reinforcing plate RP may be coupled to each other by molding or bonding.

The guide plate GP according to the present invention may be composed of the upper and lower guide plates 40 and 50, and these plates may be provided in the same shape. In the description with reference to FIG. 6A, as an example, the guide plate GP will be described as being the upper guide plate 40.

As illustrated in FIG. 6A, the upper guide plate 40 may include the upper guide hole 43 for allowing insertion of the plurality of probes 80. A plurality of upper guide holes 43 may be formed in the same number as the plurality of probes 80. In this case, in the present invention, since the number and size of the upper guide holes 43 are illustrated exaggeratedly as an example, the number and size thereof are not limited thereto.

The upper guide plate 40 may include the third guide pin insertion hole 41 for allowing alignment of the upper guide plate 40 with the upper reinforcing plate 60 provided on the surface of the upper guide plate 40, using a guide pin.

The upper guide plate 40 may include the third main bolt fastening hole 42 for allowing insertion of a bolt for coupling the upper reinforcing plate 60 and the first plate 10. In this case, the third main bolt fastening hole 42 may function as a through-hole formed to allow easy insertion of the bolt into the fourth main bolt fastening hole 62 of the upper reinforcing plate 60.

When an end of the bolt having a helical threaded portion and over which a nut is screwed is a first end of the bolt, the third main bolt fastening hole 42 illustrated in FIG. 6A may be formed to have an inner diameter that allows a second end of the bolt to be positioned in the third main bolt fastening hole 42 without contacting therewith. This may make it possible to prevent damage to the upper guide plate 40 due to a bolt that is inserted through the third main bolt fastening hole 42 and positioned in the fourth main bolt fastening hole 62 and the first main bolt fastening hole 14 to thereby couple the upper reinforcing plate 60 and the first plate 10 to each other.

The upper guide plate 40 may be coupled to the upper reinforcing plate 60, which will be described later with reference to FIG. 6B, by molding or bonding. Then, the bolt may be inserted through the third main bolt fastening hole 42 of the upper guide plate 40 and positioned in the fourth main bolt fastening hole 62 of the upper reinforcing plate 60 and the first main bolt fastening hole 14 of the first plate 10 to thereby couple the upper reinforcing plate 60 and the first plate 10 to each other. Therefore, due to the coupling between the upper reinforcing plate 60 and the first plate 10 by the bolt fastened to the fourth main bolt fastening hole 62 of the upper reinforcing plate 60 and the first main bolt fastening hole 14 of the first plate 10, the first plate 10 and the upper guide plate 40 may be coupled to each other.

The third guide pin insertion hole 41 and the third main bolt fastening hole 42 of the upper guide plate 40 illustrated in FIG. 6A are illustrated as an example, and thus the numbers and positions thereof are not limited thereto.

In the present invention, as an example, the third guide pin insertion hole 41 and the third main bolt fastening hole 42 may be arranged symmetrically with respect to a central line horizontally disposed on a plane of the upper guide plate 40 illustrated in FIG. 6A. In addition, the third guide pin insertion hole 41 and the third main bolt fastening hole 42 may be arranged symmetrically with respect to a central line vertically disposed on the plane of the upper guide plate 40.

FIG. 6B is a view illustrating the reinforcing plate RP provided on the surface of the guide plate GP when viewed from above. The reinforcing plate RP may be coupled to the surface of the guide plate GP by molding or bonding.

The reinforcing plate RP according to the present invention may be composed of the upper and lower reinforcing plates 60 and 70, and these plates may be provided in the same shape. In the description with reference to FIG. 6B, as an example, the reinforcing plate RP will be described as being the upper reinforcing plate 60 provided on the surface of the upper guide plate 40.

As illustrated in FIG. 6B, the reinforcing plate RP may include the upper cutout hole 63 for allowing the plurality of probes 80 inserted through the upper guide holes 43 of the upper guide plate 40 to be positioned therein.

The upper cutout hole 63 may be formed to have a larger area than the upper guide hole existence area of the upper guide plate 40, the upper guide hole existence area allowing insertion of the plurality of probes 80.

The reinforcing plate RP may support the upper guide plate 40 in the remaining area in which the upper cutout hole 63 is not provided, to improve mechanical strength of the upper guide plate 40.

The reinforcing plate RP coupled to the surface of the guide plate GP according to the present invention may be made of a $Si_3N_4$ material in order to improve mechanical strength. Alternatively, the reinforcing plate RP may be made of a ceramic material.

At least one of the upper and lower guide plates 40 and 50 may be made of an anodic oxide film material. Therefore, it may be possible to vertically form pluralities of upper and lower guide holes 43 and 53 for allowing insertion of the plurality of probes 80. In addition, when at least one of the upper and lower guide plates 40 and 50 is made of the anodic oxide film material, it may be possible to form the upper and lower guide holes 43 and 53 of which the size and the pitch are reduced. The present invention may have excellent mechanical strength by coupling the reinforcing plate RP made of the $Si_3N_4$ material or the ceramic material onto the surface of each of the upper and lower guide plates 40 and 50. In addition, due to the vertical upper and lower guide holes 43 and 53, it may be possible to provide the probes 80 of which the size and the pitch are reduced and to secure wear resistance.

In other words, the present invention may be excellent in terms of mechanical strength through a structure in which at least one of the upper and lower guide plates 40 and 50 is made of the anodic oxide film material and the reinforcing plate RP is coupled to the surface thereof. In addition, it may be possible to realize a reduction in size and pitch of the vertically formed probe insertion holes, and to secure wear resistance in terms of sliding friction between the probes and the probe insertion holes.

As illustrated in FIG. 6B, when the reinforcing plate RP is the upper reinforcing plate 60 coupled to the surface of the upper guide plate 40, the upper reinforcing plate 60 may include the fourth guide pin insertion hole 61. The fourth guide pin insertion hole 61 may allow a guide pin inserted through the third guide pin insertion hole 41 of the upper guide plate 40 to be positioned therein. In this case, the fourth guide pin insertion hole 61 of the upper reinforcing plate 60 and the third guide pin insertion hole 41 of the upper guide plate 40 may be formed to have the same inner diameter. This may allow easy alignment of the reinforcing plate RP with the upper guide plate 40 when the reinforcing plate RP is provided on the surface thereof.

The upper reinforcing plate 60 may include the fourth main bolt fastening hole 62 for allowing coupling of the upper reinforcing plate 60 and the first plate 10 by a bolt. The fourth main bolt fastening hole 62 may allow the bolt inserted through the third main bolt fastening hole 42 of the upper guide plate 40 to be positioned therein. In this case, the fourth main bolt fastening hole 62 may be formed to have a smaller inner diameter than the third main bolt fastening hole 42, while having the same inner diameter as the first main bolt fastening hole of the first plate 10. The bolt inserted through the third main bolt fastening hole 42 of the upper guide plate 40 may be positioned in the fourth main bolt fastening hole 62 of the upper reinforcing plate 60 and inserted into the main bolt fastening hole 14 of the first plate 10. Then, the bolt may be screwed to couple the upper reinforcing plate 60 and the first plate 10.

The fourth guide pin insertion hole 61 and the fourth main bolt fastening hole 62 of the upper reinforcing plate 60 illustrated in FIG. 6B are illustrated as an example, and thus the numbers and positions thereof are not limited thereto.

In the present invention, as an example, the fourth guide pin insertion hole 61 and the fourth main bolt fastening hole 62 may be arranged symmetrically with respect to a central line horizontally disposed on a plane of the upper reinforcing plate 60 illustrated in FIG. 6B. In addition, the fourth guide pin insertion hole 61 and the fourth main bolt fastening hole 62 may be arranged symmetrically with respect to a central line vertically disposed on the plane of the upper reinforcing plate 60.

In this case, the fourth guide pin insertion hole 61 and the fourth main bolt fastening hole 62 of the upper reinforcing plate 60 may be formed in the same shapes as the third guide pin insertion hole 41 and the third main bolt fastening hole 42 of the upper guide plate 40 illustrated in FIG. 6A. However, the third main bolt fastening hole 42 of the upper guide plate 40 may function as a through-hole for allowing the bolt to be positioned in the fourth main bolt fastening hole 62 of the upper reinforcing plate 60 and the first main bolt fastening hole 14 of the first plate 10 to couple the upper reinforcing plate 60 and the first plate 10. Therefore, the third main bolt fastening hole 42 of the upper guide plate 40 differs from the fourth main bolt fastening hole 62 of the upper reinforcing plate 60 in that the third main bolt fastening hole 42 is formed to have a larger inner diameter than the fourth main bolt fastening hole 62.

Figure 7A:
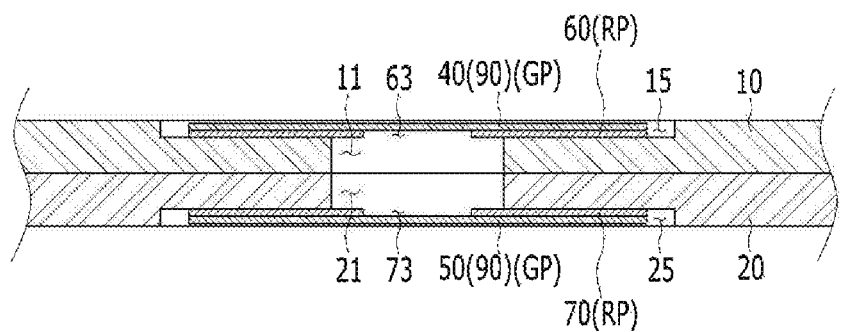
FIGS. 7A, 7B, and 7C are views schematically illustrating a process of inserting probes into the probe card according to the present invention.
Figure 7B:
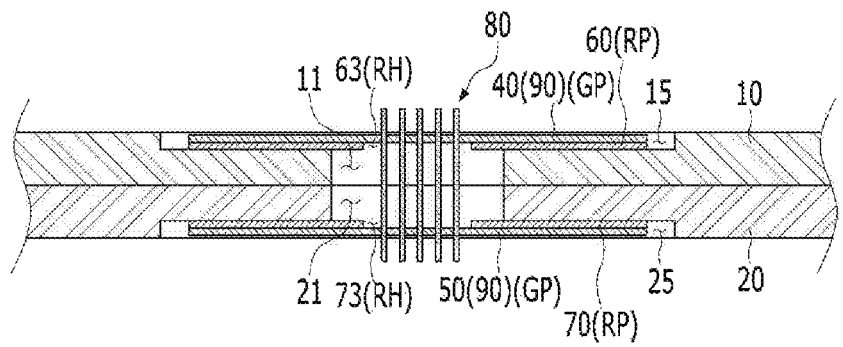
Figure 7C:
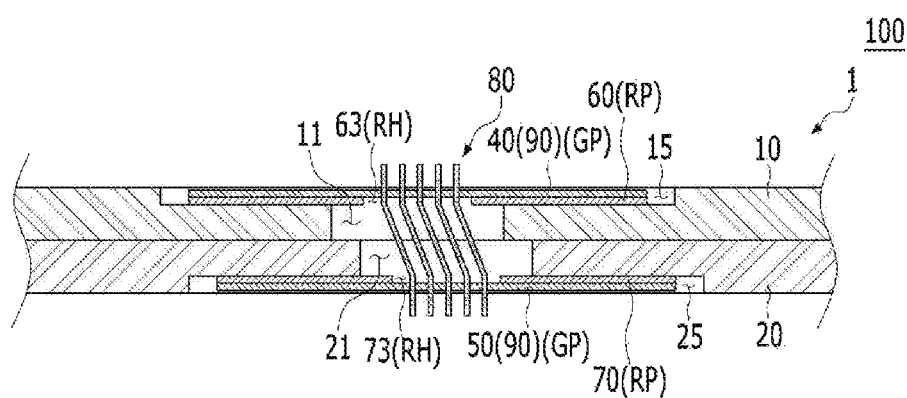

FIGS. 7A, 7B, and 7C are views schematically illustrating a process of inserting the probes 80 into the probe head 1 constituting the probe card 100 according to the present invention.

As illustrated in FIG. 7A, the second plate 20 may be provided on the lower portion of the first plate 10. The first and second plates 10 and 20 may be aligned with each other by the guide pin inserted through the upper guide pin insertion hole 13 of the first plate 10 and into the lower guide pin insertion hole 23 of the second plate 20.

The upper mounting area 15 may be formed on the upper surface of the first plate 10, and the upper guide plate 40 and the upper reinforcing plate 60 that are coupled to each other by molding or bonding may be provided in the upper mounting area 15. The lower mounting area 25 may be formed on the lower surface of the second plate 20. The lower guide plate 50 and the lower reinforcing plate 70 that are coupled to each other by molding or bonding may be provided in the lower mounting area 25.

As illustrated in FIG. 7A, the present invention may have a structure in which the upper guide plate 40, the upper reinforcing plate 60, and the first plate 10 are sequentially stacked, and the second plate 20, the lower reinforcing plate 70, and the lower guide plate 50 are sequentially stacked in a direction opposite to the upper guide plate 40, the upper reinforcing plate 60, and the first plate 10.

As illustrated in FIG. 7A, in such a structure in which the upper guide plate 40, the upper reinforcing plate 60, the first plate 10, the second plate 20, the lower reinforcing plate 70, and the lower guide plate 50 are sequentially stacked, alignment thereof may be easily achieved by the guide pin positioned in the guide pin insertion holes formed in the respective plates.

Then, as illustrated in FIG. 7B, the plurality of probes 80 may be inserted through the upper guide holes 43 of the upper guide plate 40. The plurality of probes 80 inserted through the upper guide holes 43 may be sequentially positioned in the upper cutout hole 63 of the upper reinforcing plate 60, the first through-hole 11 of the first plate 10, the second through-hole 21 of the second plate 20, and the lower cutout hole 73 of the lower reinforcing plate 70, and inserted into and through the lower guide holes 53 of the lower guide plate 50. The plurality of probes 80 may be vertically inserted through the upper and lower guide holes 43 and 53 in a straight shape. In this case, the upper and lower guide holes 43 and 53 may be located at positions corresponding to each other.

Then, as illustrated in FIG. 7C, the first plate 10 or the second plate 20 may be positionally shifted to cause the plurality of probes 80 to be elastically deformed. In this case, the guide pin positioned in the first to the sixth guide pin insertion holes 16 to 71 may be in a removed state. In the present invention, as an example, it is illustrated that the plurality of probes 80 is elastically deformed by positionally shifting the second plate 20.

In the present invention, at least one of the first plate and the second plate 20 may be positionally shifted to elastically deform the plurality of probes 80, and then the first and second plates 10 and 20 may be coupled to each other by the bolt inserted through the upper coupling hole 12 of the first plate 10 and into the lower coupling hole 22 of the second plate 20.

In addition, the first plate 10, the upper guide plate 40, and the upper reinforcing plate 60 may be coupled to each other by the bolt inserted through the third main bolt fastening hole 42 of the upper guide plate 40 and positioned in the fourth main bolt fastening hole 62 of the upper reinforcing plate 60 and the first main bolt fastening hole 14 of the first plate 10. In this case, the upper guide plate 40 and the upper reinforcing plate 60 may be in a pre-molded or pre-bonded state.

In addition, the second plate 20, the lower guide plate 50, and the lower reinforcing plate 70 may be coupled to each other by the bolt inserted through the fifth main bolt fastening hole 52 of the lower guide plate 50 and positioned in the sixth main bolt fastening hole 72 of the lower reinforcing plate 70 and the second main bolt fastening hole 24 of the second plate 20.

The order of bolt fastening of the upper guide plate 40, the upper reinforcing plate 60, the first plate 10, the second plate 20, the lower guide plate 50, and the lower reinforcing plate 70 may vary, and the present invention is not limited to any particular order. However, preferably, a bolting fastening process for each plate is performed after elastically deforming the plurality of probes 80 inserted through the upper and lower guide holes 43 and 53 in a straight shape by positionally shifting at least one of the first and second plates 10 and 20.

As illustrated in FIG. 7C, the probe card 100 according to the present invention manufactured by such a bolt fastening process may include the first plate 10 including the first through-hole 11, the second plate 20 coupled to the lower portion of the first plate 10 and including the second through-hole 21 formed at a position corresponding to the first through-hole 11, the upper guide plate 40 provided on the upper surface of the first plate 10 and including the upper guide holes 43 for allowing insertion of the probes 80, the lower guide plate 50 provided on the lower surface of the second plate 20 and including the lower guide holes 53 for allowing insertion of the probes 80 inserted through the upper guide holes 43, the upper reinforcing plate 60 provided between the upper guide plate 40 and the first plate 10 and including the upper cutout hole 63 for allowing the probes 80 inserted through the upper guide holes 43 of the upper guide plate 40 to be positioned therein, and the lower reinforcing plate 70 provided between the lower guide plate 50 and the second plate 20 and including the lower cutout hole 73 for allowing the probes 80 inserted through the upper guide holes 43 of the upper guide plate 40 to be positioned therein. The upper guide plate 40, the upper reinforcing plate 60, the first plate 10, the second plate 20, the lower reinforcing plate 70, and the lower guide plate 50 may be sequentially stacked.

With such a structure, first ends of the probes 80 may be inserted into and protrude from the upper guide holes 43 of the upper guide plate 40, intermediate body portions thereof may be positioned in the upper cutout hole 63, the first through-hole 11, the second through-hole 21, and the lower cutout hole 73, and second ends thereof may be inserted into and protrude from the lower guide holes 53 of the lower guide plate 50.

As illustrated in FIG. 7, the upper and lower guide plates 40 and 50 and the upper and lower reinforcing plates 60 and 70 may be configured to have smaller areas than the first and second plates 10 and 20. Therefore, the surfaces of the first and second plates 10 and 20 may be exposed.

In the present invention, by providing the upper and lower guide plates 40 and 50 and upper and lower reinforcing plates 60 and 70 to have smaller areas than the first and second plates 10 and 20, handling may be facilitated. In addition, it may be easier to achieve uniform flatness of the upper and lower guide plates 40 and 50 defining substantial probing areas and in which the probes 80 are directly inserted.

In addition, in the present invention, since at least one of the upper and lower guide plates 40 and 50 may be made of an anodic oxide film material, high visibility may be achieved in terms of provision of the probes 80.

Specifically, in the related art, a guide plate, which is made of a ceramic material, a resin material, or a silicon material and having a through-hole for allowing insertion of the probes 80, has a low transmittance, and thus there is a problem in that it is difficult to insert the probes 80 into the through-holes of the upper and lower guide plates 2 and 3. This causes a defect problem due to an error in the insertion positions of the probes 80 (e.g., upper and lower through-holes that do not correspond to each other).

However, the anodic oxide film material used in the present invention may have a transmittance (specifically equal to or greater than 80%) that allows configurations provided at different positions of the probe head 1 to be visible to naked eyes. In other words, the anodic oxide film material may have a relatively high transmittance.

Therefore, this may allow to easily perform a process of vertically inserting the straight probes 80 through the upper and lower guide holes 43 and 53 formed at positions corresponding to each other. Specifically, the probes 80 may be easily inserted into and through the lower guide holes 53 located at positions corresponding to the upper guide holes 43 through which the front ends of the probes 80 are first inserted. As a result, the time required for the process of inserting the probes 80 may be drastically reduced, thereby increasing the efficiency of a process of manufacturing the probe card 100.

In addition, when performing the process of inserting the probes 80 by an automated process through equipment provided with a vision sensor, etc. in the future, it may be possible to identify the upper and lower guide holes 43 and 53 located corresponding to each other due to the high transmittance of the anodic oxide film material, and thus there is an advantage in that it is easy to perform the automated process of inserting the probes 80.

In the present invention, the first and second plates 10 and 20 supporting the upper and lower guide plates 40 and 50 on the respective surfaces thereof may be made of a ceramic material, thereby realizing the probe card 100 having higher durability in terms of mechanical strength.

Alternatively, in the present invention, the first and second plates 10 and 20 may be made of a metal material, thereby realizing the probe card 100 having an advantage in terms of heat dissipation. Specifically, as illustrated in FIGS. 7A, 7B, and 7C, the present invention may have a structure in which the upper and lower guide plates 40 and 50 has smaller areas than the first and second plates 10 and 20 so that the surfaces of the first and second plates 10 and 20 are exposed. In this case, the first and second plates 10 and 20 made of the metal material may perform a heat dissipation function by the exposed surfaces. The probe card 100 may be exposed to high temperatures during a burn-in test. In this case, the temperature of the entire probe card 100 may be increased. The probe card 100' according to the related art may have a structure in which the upper and lower guide plates 2 and 3 in which the probes 80 are inserted define the entire area of the probe head 1 and cover an intermediate plate 4. Therefore, when the intermediate plate 4 is heated as the temperature of the probe card 100' is increased, it may be difficult for heat of the intermediate plate 4 to be dissipated. As a result, as the probe card 100' is thermally expanded, elongation or warpage may occur, resulting in a change in positions of the holes for allowing insertion of the probes 80. This may cause a problem of a reduction in positional accuracy of the front ends of the probes 80.

However, in the present invention, the first and second plates 10 with the guide holes for allowing insertion of the probes 80 have smaller areas than the first and second plates 10 and 20 so that the surfaces of the first and second plates 20 are exposed, and the first and second plates 10 and 20 may be made of the metal material, thereby providing a structure having an advantage in terms of heat dissipation. As a result, by realizing the probe card 100 exhibiting excellent heat dissipation performance during a burn-in test process, it is possible to prevent a problem of a change in positions of the upper and lower guide holes 43 and 53 due to thermal expansion, and a reduction in positional accuracy of the probes 80.

In other words, the probe card 100 according to the present invention may include the first plate 10 made of a metal material and including the first through-hole 11, the second plate 20 coupled to the lower portion of the first plate 10, made of a metal material, and including the second through-hole 21, the upper guide plate 40 provided on the upper surface of the first plate 10 to have a smaller area than the first plate 10 and including the upper guide holes 43 for allowing insertion of the probes 80, the lower guide plate 50 provided on the lower surface of the second plate 20 to have a smaller area than the second plate 20 and including the lower guide holes 53 for allowing insertion of the probes 80, the upper reinforcing plate 60 provided between the first plate 10 and the upper guide plate 40 and including the upper cutout hole 63 for allowing the probes 80 to be positioned therein, and the lower reinforcing plate 70 provided between the second plate 20 and the lower guide plate 50 and including the lower cutout hole 73 for allowing the probes 80 to be positioned therein. The upper guide plate 40, the upper reinforcing plate 60, the first plate 10, the second plate 20, the lower reinforcing plate 70, and the lower guide plate 50 may be sequentially stacked, and the surfaces of the first and second plates 10 and 20 may be exposed.

With such a configuration and structure, it may be possible to exhibit excellent effects in terms of heat dissipation, and to prevent a problem of reducing positional accuracy of the upper and lower guide holes 43 and 53 and the probes 80 due to thermal deformation during a burn-in test. As a result, it may be possible to effectively perform a process using the probe card 100 (e.g., a burn-in test process).

Figure 8A:
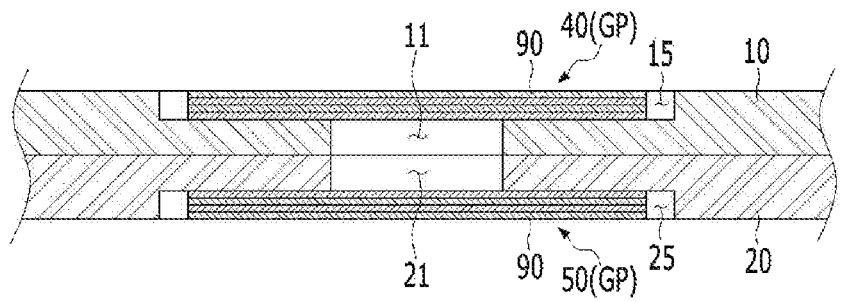
FIGS. 8A, 8B, and 8C are views schematically illustrating a modified example of the present invention.
Figure 8B:
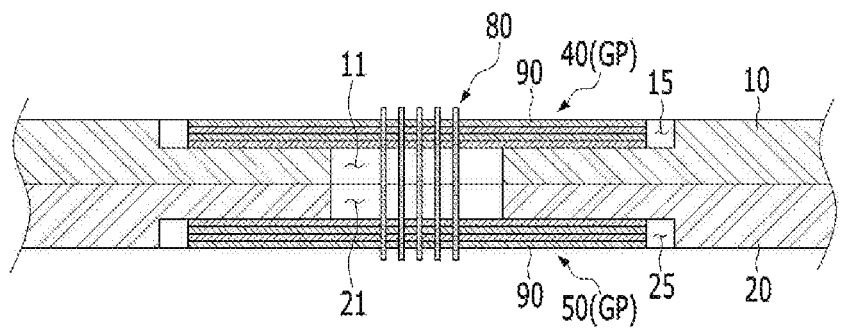
Figure 8C:
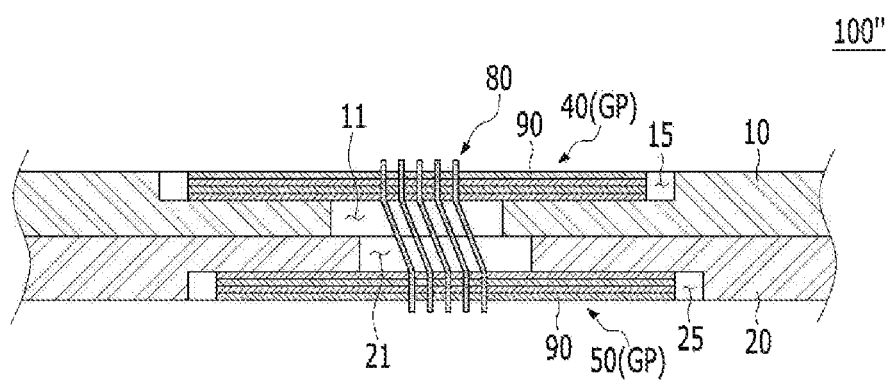

FIGS. 8A, 8B, and 8C are views schematically illustrating a modified example of the present invention. The modified example differs from the embodiment in that at least one of upper and lower guide plates 40 and 50 is configured by stacking a plurality of anodic oxide films 90.

As illustrated in FIGS. 8A, 8B, and 8C, at least one of the upper and lower guide plates 40 and 50 according to the present invention may be configured so that the plurality of anodic oxide films 90 are stacked. In the present invention, as an example, as illustrated in FIGS. 8A, 8B, and 8C, each of the upper and lower guide plates 40 and 50 may be configured by stacking the plurality of anodic oxide films 90.

As illustrated in FIG. 8A, the upper guide plate 40 configured by stacking the plurality of anodic oxide films 90 may be provided in an upper mounting area 15 of a first plate 10. A second plate 20 may be coupled to a lower portion of the first plate 10. The lower guide plate 50 configured by stacking the plurality of anodic oxide films 90 may be provided in a lower mounting area 25 of the second plate 20.

Upper and lower guide holes 43 and 53 for allowing insertion of a plurality of probes 80 may be collectively formed in the upper and lower guide plates 40 and 50 configured by stacking the pluralities of anodic oxide films 90. In this case, the upper and lower guide holes 43 and 53 may be formed by an etching process. Therefore, this may result in more efficient manufacturing in terms of manufacturing the upper and lower guide plates 40 and 50.

In addition, when the upper and lower guide plates 40 and 50 are provided in a structure in which the pluralities of anodic oxide films 90 are stacked, mechanical strength may be improved. Therefore, a guide plate GP having a structure in which the pluralities of anodic oxide films 90 are stacked has an advantage in that it is possible to efficiently provide the upper and lower guide holes 43 and 53 while having excellent mechanical strength.

As illustrated in FIG. 8B, the probes 80 may be inserted through the upper guide holes 43 of the upper guide plate 40 configured by stacking the plurality of anodic oxide films 90. First ends of the probes 80 inserted through the upper guide holes 43 may protrude from an upper surface of the upper guide plate 40, intermediate body portions may be positioned in a first through-hole 11 and a second through-hole 21, and second ends thereof may be inserted into and protrude from the lower guide holes 53.

Then, as illustrated in FIG. 8C, at least one of the first plate 10 and the second plate 20 may be positionally shifted to cause the probes 80 to be elastically deformed.

A probe card 100" according to the modified example may be manufactured by bolt fastening as in the probe card 100 according to the embodiment, and a bolt fastening process may remain the same as the bolt fastening process of the embodiment referring to FIG. 7.

Meanwhile, in the upper and lower guide plates 40 and 50 configured by stacking the pluralities of anodic oxide films 90 as in the modified example, a reinforcing plate RP may be provided on at least a surface of each of the upper and lower guide plates 40 and 50.

In this case, the reinforcing plate RP may be positioned between the plurality of anodic oxide films 90, or may be provided on at least a surface of a structure in which the plurality of anodic oxide films 90 are stacked. The reinforcing plate RP may have a cutout hole RH in the same shape as that of the embodiment.

Therefore, when the reinforcing plate RP is provided between the plurality of anodic oxide films 90, the reinforcing plate RP may support the plurality of anodic oxide films 90 on upper and lower surfaces thereof between the plurality of anodic oxide films 90, thereby improving mechanical strength. On the other hand, when the reinforcing plate RP is provided on at least the surface of the structure in which the plurality of anodic oxide films 90 are stacked, the reinforcing plate RP may support the plurality of anodic oxide films 90 on the upper or lower surface thereof, thereby improving mechanical strength.

In the present invention, by making the guide plate GP, which serves to guide the front ends of the probes, with an anodic oxide film material, it may be possible to realize a reduction in size and pitch of the probe insertion holes. In addition, due to the provision of the probe insertion holes, the guide plate GP substantially defining the probing area may be configured to have a smaller area than the first and second plates 10 and 20 supporting the guide plate GP, thereby making it possible to realize a structure that is easy to handle.

In addition, the present invention may realize a structure in which the upper and lower guide plates 40 and 50 are provided in at least a partial area of the probe head 1, thereby making it possible to achieve more uniform flatness of the upper and lower guide plates 40 and 50. As a result, it may be possible to obtain an effect of improving positional accuracy of the probes 80 in terms of the provision of the probes 80.

Although the exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A probe card, comprising:
   a first plate;
   a second plate coupled to a lower portion of the first plate;
   an upper guide plate provided on an upper surface of the first plate;
   a lower guide plate provided on a lower surface of the second plate;
   an upper reinforcing plate provided between the first plate and the upper guide plate; and
   a lower reinforcing plate provided between the second plate and the lower guide plate,
   wherein at least one of the upper and lower guide plates is made of an anodic oxide film material, and
   wherein when viewed from above, the upper and lower guide plates and the upper and lower reinforcing plates are configured to have smaller areas than the first and second plates, so that upper and lower surfaces of the first and second plates are exposed,
   wherein each of the first plate, the second plate, the upper guide plate, the lower guide plate, the upper reinforcing plate, and the lower reinforcing plate has a guide pin insertion hole, and
   wherein all of the guide pin insertion holes are inserted by a guide pin to allow the first plate, the second plate, the upper guide plate, the lower guide plate, the upper reinforcing plate, and the lower reinforcing plate to be aligned with each other.

2. The probe card of claim 1, wherein the upper guide plate is provided in an upper mounting area formed on the upper surface of the first plate, and
   the lower guide plate is provided in a lower mounting area formed on the lower surface of the second plate.

3. The probe card of claim 2, wherein the upper mounting area is configured as a concave recess in the upper surface of the first plate, and
   the lower mounting area is configured as a concave recess in the lower surface of the second plate.

4. The probe card of claim 1, further comprising:
   a first through-hole formed in the first plate; and
   a second through-hole formed in the second plate at a position corresponding to the first through-hole,
   wherein a plurality of probes is positioned in the first and second through-holes.

5. The probe card of claim 1, wherein one of the upper and lower reinforcing plates comprises a cutout hole for allowing the plurality of probes to be positioned therein.

6. The probe card of claim 1, wherein the first and second plates are made of a metal material.

7. The probe card of claim 1, wherein the first and second plates are made of a ceramic material.

8. The probe card of claim 1, wherein one of the upper and lower reinforcing plates is made of a $Si_3N_4$ material.

9. The probe card of claim 1, wherein one of the upper and lower reinforcing plates is made of a ceramic material.

10. The probe card of claim 1, wherein at least one of the upper and lower guide plates is configured by stacking a plurality of anodic oxide films.

11. A probe card, comprising:
    a first plate including a first through-hole;
    a second plate coupled to a lower portion of the first plate and including a second through-hole;
    an upper guide plate provided on an upper surface of the first plate and including an upper guide hole for allowing insertion of a probe;
    a lower guide plate provided on a lower surface of the second plate and including a lower guide hole for allowing insertion of the probe;
    an upper reinforcing plate provided between the first plate and the upper guide plate and including an upper cutout hole; and
    a lower reinforcing plate provided between the second plate and the lower guide plate and including a lower cutout hole,
    wherein the first and second plates are positioned between the upper guide plate and the upper reinforcing plate, and the lower guide plate and the lower reinforcing plate so as to support the upper guide plate and the upper reinforcing plate, and the lower guide plate and the lower reinforcing plate,
    wherein when viewed from above, the upper guide plate and the upper reinforcing plate, and the lower guide plate and the lower reinforcing plate are configured to have smaller areas than the first and second plates, so that upper and lower surfaces of the first and second plates are exposed,
    wherein each of the first plate, the second plate, the upper guide plate, the lower guide plate, the upper reinforcing plate, and the lower reinforcing plate has a guide pin insertion hole, and
    wherein all of the guide pin insertion holes are inserted by a guide pin to allow the first plate, the second plate, the upper guide plate, the lower guide plate, the upper reinforcing plate, and the lower reinforcing plate to be aligned with each other.

12. A probe card, comprising:
    a first plate including a first through-hole;
    a second plate coupled to a lower portion of the first plate and including a second through-hole formed at a position corresponding to the first through-hole;
    an upper guide plate provided on an upper surface of the first plate and including an upper guide hole for allowing insertion of a probe;
    a lower guide plate provided on a lower surface of the second plate and including a lower guide hole for allowing insertion of the probe inserted through the upper guide hole;
    an upper reinforcing plate provided between the upper guide plate and the first plate and including an upper cutout hole for allowing the probe inserted through the upper guide hole of the upper guide plate to be positioned therein; and
    a lower reinforcing plate provided between the lower guide plate and the second plate and including a lower cutout hole for allowing the probe inserted through the upper guide hole of the upper guide plate to be positioned therein,
    wherein the upper guide plate, the upper reinforcing plate, the first plate, the second plate, the lower reinforcing plate, and the lower guide plate are sequentially stacked,
    wherein a first end of the probe is inserted into and protrudes from the upper guide hole of the upper guide plate, an intermediate body portion thereof is positioned in the upper cutout hole, the first through-hole, the second through-hole, and the lower cutout hole, and a second end thereof is inserted into and protrudes from the lower guide hole of the lower guide plate,
    wherein when viewed from above, the upper and lower guide plates and the upper and lower reinforcing plates are configured to have smaller areas than the first and second plates, so that upper and lower surfaces of the first and second plates are exposed, wherein each of the first plate, the second plate, the upper guide plate, the lower guide plate, the upper reinforcing plate, and the lower reinforcing plate has a guide pin insertion hole, and wherein all of the guide pin insertion holes are inserted by a guide pin to allow the first plate, the second plate, the upper guide plate, the lower guide plate, the upper reinforcing plate, and the lower reinforcing plate to be aligned with each other.

13. A probe card, comprising:

a first plate made of a metal material and including a first through-hole;

a second plate coupled to a lower portion of the first plate, made of a metal material, and including a second through-hole;

an upper guide plate provided on an upper surface of the first plate to have smaller area than the first plate and including an upper guide hole for allowing insertion of a probe;

a lower guide plate provided on a lower surface of the second plate to have smaller area than the second plate and including a lower guide hole for allowing insertion of the probe;

an upper reinforcing plate provided between the first plate and the upper guide plate and including an upper cutout hole for allowing the probe to be positioned therein; and a lower reinforcing plate provided between the second plate and the lower guide plate and including a lower cutout hole for allowing the probe to be positioned therein, wherein the upper guide plate, the upper reinforcing plate, the first plate, the second plate, the lower reinforcing plate, and the lower guide plate are sequentially stacked, wherein when viewed from above, the upper and lower guide plates and the upper and lower reinforcing plates are configured to have smaller areas than the first and second plates, so that upper and lower surfaces of the first and second plates are exposed, wherein each of the first plate, the second plate, the upper guide plate, the lower guide plate, the upper reinforcing plate, and the lower reinforcing plate has a guide pin insertion hole, and wherein all of the guide pin insertion holes are inserted by a guide pin to allow the first plate, the second plate, the upper guide plate, the lower guide plate, the upper reinforcing plate, and the lower reinforcing plate to be aligned with each other.

* * * * *